(12) United States Patent
Hiraga

(10) Patent No.: US 6,378,121 B2
(45) Date of Patent: *Apr. 23, 2002

(54) AUTOMATIC GLOBAL ROUTING DEVICE FOR EFFICIENTLY DETERMINING OPTIMUM WIRING ROUTE ON INTEGRATED CIRCUIT AND GLOBAL ROUTING METHOD THEREFOR

(75) Inventor: Takefumi Hiraga, Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/048,587

(22) Filed: Mar. 27, 1998

(30) Foreign Application Priority Data

Mar. 27, 1997 (JP) .............................. 9-075609

(51) Int. Cl.[7] .............................................. G06F 17/50
(52) U.S. Cl. ............................................ 716/13; 716/14
(58) Field of Search .................... 716/4, 13, 9, 11, 716/7, 5, 14, 6

(56) References Cited

U.S. PATENT DOCUMENTS

| 5,361,214 | A | | 11/1994 | Aoki ........................... 364/490 |
| 5,416,720 | A | * | 5/1995 | Fukui ........................... 716/9 |
| 5,583,788 | A | * | 12/1996 | Kuribayashi .................. 716/14 |
| 5,801,959 | A | * | 9/1998 | Ding et al. .................... 716/11 |
| 5,825,659 | A | * | 10/1998 | Nguyen et al. ................. 716/4 |
| 5,847,965 | A | * | 12/1998 | Cheng ........................... 716/9 |
| 5,889,677 | A | * | 3/1999 | Yasuda et al. .................. 716/6 |
| 5,923,569 | A | * | 7/1999 | Kumashiro et al. ............. 716/7 |
| 5,980,093 | A | * | 11/1999 | Jones et al. .................... 716/5 |
| 6,011,912 | A | * | 1/2000 | Yui et al. ...................... 716/13 |

FOREIGN PATENT DOCUMENTS

| JP | 63-272094 | 11/1988 |
| JP | 2-292845 | 12/1990 |
| JP | 3-278446 | 12/1991 |
| JP | 4-67651 | 3/1992 |
| JP | 4-192544 | 7/1992 |
| JP | 5-67178 | 3/1993 |
| JP | 6-45446 | 2/1994 |
| JP | 7-29980 | 1/1995 |

* cited by examiner

Primary Examiner—Matthew Smith
Assistant Examiner—Jibreel Speight
(74) Attorney, Agent, or Firm—Foley & Lardner

(57) ABSTRACT

Automatic routing device which automatically conducts placement and routing of integrated circuits on an integrated circuit chip, including a wire capacitance calculating unit, a degree of wire congestion calculating unit and a routing checking unit for determining whether routing of a desired net is possible or not based on a degree of wire congestion at each global routing cell boundary formed by the division of a logic circuit chip to be processed into global routing cells, and a number of grids calculating units, a grid use rate calculating unit and a grid use rate checking unit for determining whether routing of a desired net is possible or not based on a state of the use of a routing track grid in each global routing cell formed on the logic circuit chip.

14 Claims, 13 Drawing Sheets

NUMBER OF USABLE GRIDS = 18

EXAMPLES OF ESTIMATED NUMBER OF GRIDS TO BE USED
(PER NET) ACCORDING TO PASSING ROUTE PATTERNS

501 PASSING ROUTE
PASSING ROUTE 502
503 PASSING ROUTE

TWO PASS
ONE PASSES
ONE PASSES

NUMBER OF PASSING NETS OF ALREADY DETERMINED ROUTES

ESTIMATED NUMBER OF GRIDS TO BE USED FOR EACH ROUTE

PASSING ROUTE 1(501?): (5/2+5/2)*2=10
PASSING ROUTE 2(502?): 5*1=5
PASSING ROUTE 3(503?): (5/2+5/2)*1=5

ESTIMATED NUMBER OF GRIDS TO BE USED WITHIN GLOBAL ROUTING CELL

10+5+5=20

GRID USE RATE

20/18=1.11

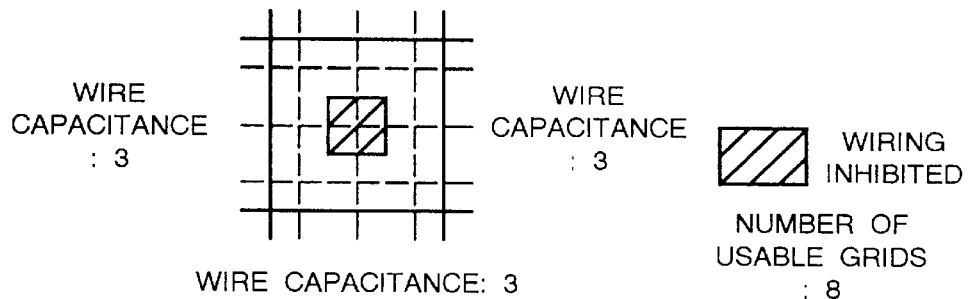

WIRE CAPACITANCE: 3

WIRE CAPACITANCE : 3

WIRE CAPACITANCE : 3

WIRE CAPACITANCE: 3

▨ WIRING INHIBITED

NUMBER OF USABLE GRIDS : 8

FIG. 6(A)

THREE WIRES

FIG. 6(B)

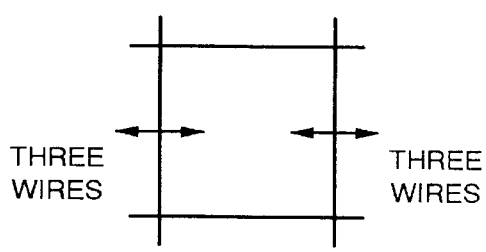

THREE WIRES    THREE WIRES

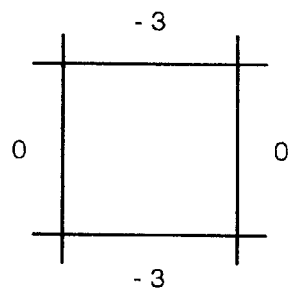

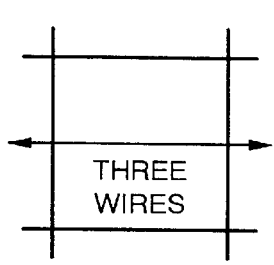

THREE WIRES

GRID USE RATE

ESTIMATED NUMBER OF GRIDS TO BE USED PER ONE WIRE : 3

ESTIMATED NUMBER OF GRIDS TO BE USED WITHIN GLOBAL ROUTING CELL : 9

GRID USE RATE : 9/8 = 1.12

FIG. 6(D)

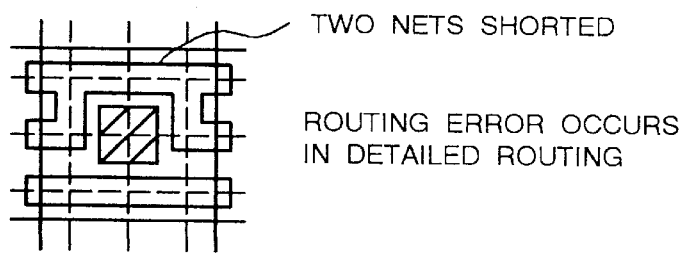

TWO NETS SHORTED

ROUTING ERROR OCCURS IN DETAILED ROUTING

FIG. 6(E)

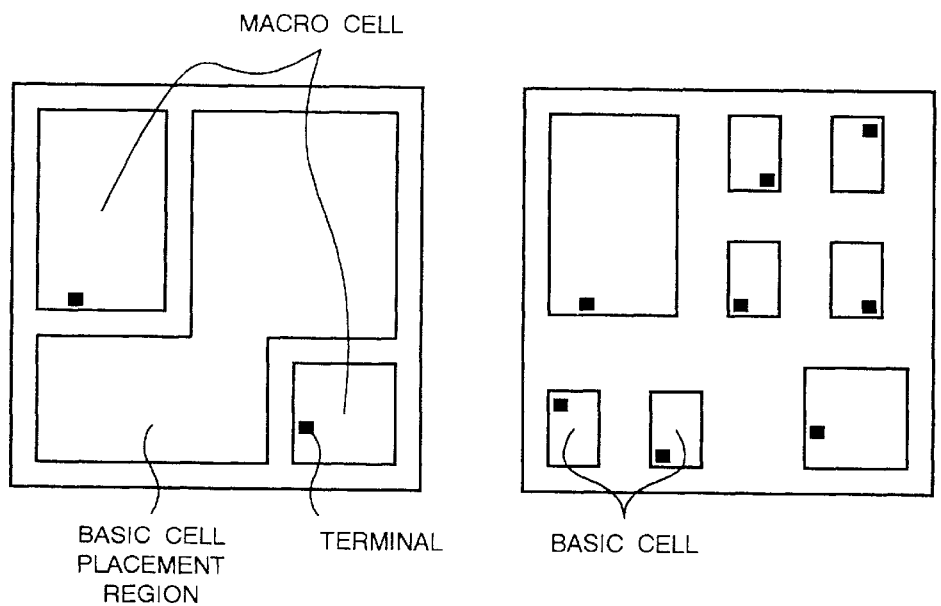
FIG. 8(A) FLOOR PLAN
(PRIOR ART)
FIG. 8(B) PLACEMENT
(PRIOR ART)
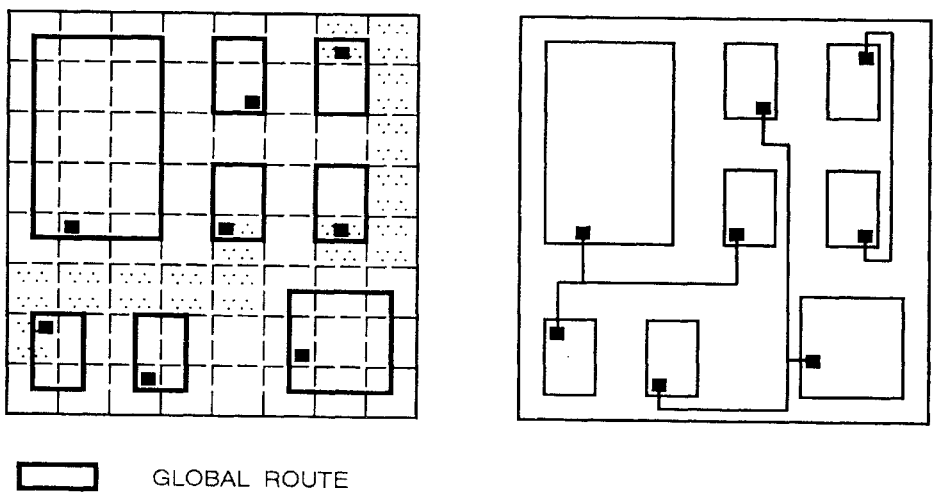
☐ GLOBAL ROUTE
FIG. 8(C) GLOBAL ROUTING
(PRIOR ART)
FIG. 8(D) DETAILED ROUTING
(PRIOR ART)

GLOBAL ROUTING CELL BOUNDARY PASSED THROUGH

GLOBAL ROUTING CELL PASSED THROUGH

NUMBER OF PASSING NETS OF ALREADY DETERMINED ROUTES

DEGREE OF WIRE CONGESTION

AUTOMATIC GLOBAL ROUTING DEVICE FOR EFFICIENTLY DETERMINING OPTIMUM WIRING ROUTE ON INTEGRATED CIRCUIT AND GLOBAL ROUTING METHOD THEREFOR

BACKGROUND OF THE INVENTION

1. Field of the Invention

The present invention relates to an automatic global routing device, in a CAD system which designs and develops a large-scale integrated circuit (LSI) and a logic circuit by means of a computer, for automatically placement and routing component cells on LSI chips or printed boards so as to minimize the entire size or minimize a routing length and a global routing method therefor.

2. Description of the Related Art

Automatic placement and routing processing of this kind for placement and routing integrated circuit chips by an automatic routing device using a CAD system is executed in four steps, floor plan processing, placement processing, global routing processing and detailed routing processing.

In the following, conventional automatic placement and routing methods will be described with reference to FIGS. 7 and 8. First, at the floor plan processing, one places macro cells on an integrated circuit to be processed, and determines a region in which basic cells are to be placed as shown in FIG. 8(A) (Step 701 of FIG. 7). This floor plan processing is conducted semi-automatically. Next, determination is made whether routing processing is possible for the integrated circuit subjected to the floor plan processing (Step 702). When the determination is made that routing is impossible, the routine returns to Step 701 to execute the floor plan processing over again.

When the determination is made at Step 702 that routing is possible, one places desired basic cells at the basic cell placement region as shown in FIG. 8(B) (Step 703). Then, determination is made whether routing processing is possible for the integrated circuit subjected to the basic cell placement processing (Step 704). When the determination is made that routing is impossible, the routine returns to Step 703 to conduct the placement processing over again. When the determination is still made at Step 704 that routing is impossible even after further trials of the placement processing a preset number of times, the routine returns to Step 701 to start over with the floor plan processing.

When the determination is made at Step 704 that routing is possible, one divides the integrated circuit chip to be processed into rectangles (global routing cells) and determines a routing route of each net on a divisional unit basis as shown in FIG. 8(C) (Step 705). "Net" here represents a route from an output terminal of an arbitrary gate circuit to an input terminal of other gate circuit. For each net, net information indicating which terminals are to be connected is defined. Global routing processing at Step 705 is conducted based only on a wire capacitance of a global routing cell boundary (degree of wire congestion) as will be described later. Next, determination is made whether routing processing is possible for the integrated circuit subjected to the global routing processing (Step 706). When the determination is made that routing is impossible, the routine returns to Step 705 to conduct the global routing processing over again. When the determination is still made at Step 706 that routing is impossible even after further trials of the global routing processing a preset number of times, the routine returns to Step 703 to conduct the placement processing over again. Furthermore, when the determination is still made at Step 706 that routing is impossible even after further trial of the placement processing a preset number of times, the routine returns to Step 701 to start over with the floor plan processing.

When the determination is made at Step 706 that routing is possible, one determines a detailed routing route within each global routing cell as shown in FIG. 8(D) (Step 707). Then, one determines if there is a shorted net or an unrouted net (Step 708). When there is a shorted net or an unrouted net, the routine returns to Step 707 to conduct the detailed routing processing over again. If a shorted net or an unrouted net is still detected at Step 708 even after further trials of the detailed routing processing preset times, the routine returns to Step 705 to conduct the global routing processing over again. Further, when a shorted place or a place yet to be wired is still detected at Step 708 even after further executions of the global routing processing preset times, the routine returns to Step 703 to start over with the placement processing. Further, if a shorted place or a place yet to be wired is still detected at Step 708 even after further executions of the placement processing preset times, the routine returns to Step 701 to start over with the floor plan processing. Then, when there remains neither a shorted place nor a place yet to be wired (yes at Step 708), the automatic placement and routing processing is completed.

Next, with reference to FIG. 9, detailed description will be made of the global routing processing (FIG. 7, Step 705) and the following routing possibility/impossibility determination processing (FIG. 7, Step 706) at the conventional automatic placement and routing processing. Conventional global routing processing of this kind is disclosed, for example, in Japanese Patent Laying-open (Kokai) No. Heisei 3-278446, entitled "Automatic Routing Method for Semiconductor Device".

First, as shown in FIG. 10(A), divide a chip into rectangles (global routing cells) (Step 901). In FIG. 10(A), a black square represents a terminal, while a region denoted by slant lines represents a global route for the connection of terminals. "Global routing cell" is also called a unit routing region. In the figure, a boundary between adjacent global routing cells is called a "global routing cell boundary". More specifically, each global routing cell has four global routing boundaries in the upper, lower, right and left directions.

Next, calculate a wire capacitance which indicates how many wires can pass through each global routing cell boundary (Step 902). With reference to FIG. 11, a method of calculating a wire capacitance will be described. In FIG. 11, one specific global routing cell is denoted by solid lines and a routing track is denoted by a dotted line. Here, "routing track" represents a passage on which routing can be made. "Wire capacitance" is therefore equal to the number of routing tracks passing through a global routing cell boundary. In addition, a routing inhibited region is denoted as a block of slant lines. In practice, routing is made over a plurality of layers. In other words, routing tracks and routing inhibited regions exist individually on each layer in practice. In this example, description will be made of one-layer routing for the purpose of simplicity. In the example illustrated in FIG. 11, five routing tracks exist in the right-and-left direction and five routing tracks also exist in the up-and-down direction. In this case, if there exists no routing inhibited region within the global routing cell and on the global routing cell boundaries, a wire capacitance of each global routing cell boundary will be 5.

However, since a routing inhibited region exists in practice as illustrated in FIG. 11, a wire capacity of each global routing cell boundary will be 5 or less than 5 which is a value derived from the number of routing tacks. In the example shown in FIG. 11, the symbol "○" on a global routing cell boundary denotes a passable track, and a wire capacity of the upper global routing cell boundary is 3, that of the lower global routing cell boundary is 4, that of the left-side global routing cell boundary is 5 and that of the right-side global routing cell boundary is 3. Here, according to the above literature, a wire capacity is obtained as the number of routing tracks allowing routing which is estimated based on a distribution of obstructions within the global routing cell (routing inhibited region). In the global routing processing, therefore, a routing route is selected such that a wire capacity will not exceed an estimated value at each global routing cell boundary.

Next, based on a wire capacity of a global routing cell boundary and already determined global routes, calculate a degree of congestion of wires which indicates how many wires can be actually passed through a global routing cell boundary (Step 903). With a global route set as shown in FIG. 10(A), a global routing cell boundary through which a wire passes is denoted by an arrow in FIG. 10(B) and a global routing cell through which a wire passes is denoted as a block of heavy solid lines. This calculation of a degree of wire congestion is made per one net yet to be wired, using the following expression:

[[degree of wire congestion]=[the number of passing global routes]-[wire capacity].

Therefore, the higher a value of the degree of wire congestion is, that is, the closer to zero the value is, the more wires are congest. Zero value of the degree of wires congestion indicates that no more routing is possible on the global routing cell boundary. With reference to FIGS. 12 and 13 in addition to FIG. 11, a method of calculating a degree of wire congestion will be described. FIG. 12 shows already determined global routes. In this example, two global routes pass through the upper global routing cell boundary, one passes through the lower global routing cell boundary, two pass through the left-side global routing cell boundary and three pass through the right-side global routing cell boundary. Calculation of a degree of wire congestion based on the wire capacities shown in FIG. 11 and the global routes shown in FIG. 12 results in that the degree of wire congestion on the upper global routing cell boundary will be −1 (=2−3) as shown in FIG. 13 because the number of passing global routes is two and the wire capacitance is 3. Similarly, the degree of wire congestion on the lower global routing cell boundary will be −3 (=1−4), that of the left-side global routing cell boundary will be −3 (=2−5)and that of the right-side global routing cell boundary will be 0 (=3−3).

Next, based on the cost of distance, the cost of a degree of wire congestion on a global routing cell boundary, the cost of bend and other various kinds of costs, one determines a routing route minimizing these costs (Step 904). Then, Steps 903 and 904 will be repeated until there remains no more unrouted net (Step 905). In other words, determination of a route minimizing these costs is made through Steps 903, 904 and 905 taking wire capacitances into consideration until no unrouted net wired is left.

When no more nets remain to be wired (no at Step 905), determination is made whether there exists a global routing cell boundary at which the number of passing wires exceeds its wire capacitance (that is, a global routing cell boundary with a positive value of the degree of wire congestion) (Step 906). Here, when there exists a global routing cell boundary at which the number of passing wires exceeds its wire capacitance, one rips up a net which passes through the global routing cell boundary (Step 907) to return to Step 903. On the other hand, when there exists no global routing cell boundary at which the number of passing wires exceeds its wire capacitance, the global routing processing is completed.

The automatic placement and routing processing by a conventional automatic routing device, however, has the following drawback because global routing processing is conducted taking only a wire capacitance of a global routing cell boundary into consideration, that is, based only on a degree of wire congestion as mentioned above.

Consideration will be given of a global routing cell with three routing tracks existing in the right-and-left direction and three routing tracks also in the up-and-down direction as illustrated in FIG. 14(A). It is assumed that in this global routing cell, a region denoted by slant lines and including a point of intersection between the central routing track in the right-and-left direction and the central routing track in the up-and-down direction (hereinafter referred to as a central point of intersection) is a routing inhibited region. In such a case, wire capacitances of the respective global routing cell boundaries are all 3.

With this global routing cell, to pass three wires as a global route in the right-and-left direction as shown in FIG. 14(B) results in having such degrees of wire congestion on the global routing cell boundaries as shown in FIG. 14(C), none of which has a positive value (i.e., none of which has exceeded routing cell capacity). In other words, the number of nets passing through the global routing cell boundary does not exceed a wire capacitance. Determination is therefore made here that the routing in question is possible. However, since routing that passes through the central point of intersection is actually impossible because of the existence of the routing inhibited region, even if determination is made at the global routing processing that routing is possible, routing error will occur at the subsequent detailed routing processing as shown in FIG. 14(D). This is because two nets are shorted as illustrated in FIG. 14(D). As a result, the global routing processing or the preceding placement processing and floor plan processing must be conducted over again.

In brief, automatic routing and placement processing by a conventional automatic routing device has a disadvantage in taking much time because even when determination is made at global routing processing that routing is possible, it is highly probable that determination will be made at the detailed routing processing that such routing is impossible.

SUMMARY OF THE INVENTION

An object of the present invention is to provide an automatic routing device enabling reduction in time required for automatic placement and routing processing by lessening a probability that routing determined to be possible at global routing processing will be determined to be impossible at detailed routing processing.

According to the first aspect of the invention, automatic routing device for automatically conducting placement and routing of integrated circuits on an integrated circuit chip to be processed, comprises first determination means for determining whether routing of a desired net is possible or not based on a wire capacitance at each global routing cell boundary formed by the division of the logic circuit chip into global routing cells, and second determination means for determining whether routing of a desired net is possible or not based on a state of the use of a routing track grid in each global routing cell formed on the logic circuit chip.

In the preferred construction, the second determination means determines whether routing of the desired net is possible or not based on, out of grids as points of intersection between the routing tracks, the number of grids usable for routing.

In the preferred construction, the second determination means comprises number of usable grids calculating means for calculating, out of grids as points of intersection between the routing tracks, the number of grids usable for routing, number of grids to be used calculating means for calculating, based on a passing route of wires passing in the global routing cell, the number of grids to be used by the wires out of the grids, and routing possibility/impossibility determining means for determining whether routing of the desired net is possible or not based on a ratio of the number of grids usable for routing to the number of grids to be used by the wires.

In the preferred construction, the second determination means comprises number of usable grids calculating means for calculating, out of grids as points of intersection between the routing tracks, the number of grids usable for routing, number of grids to be used calculating means for calculating, based on a passing route of wires passing in the global routing cell, the number of grids to be used by the wires out of the grids, and determination means for comparing the number of grids usable for routing and the number of grids to be used by wires to determine that the routing is impossible when the number of grids to be used by wires is larger.

According to the second aspect of the invention, an automatic routing device for automatically conducting placement and routing of integrated circuits on an integrated circuit chip to be processed, comprises floor plan determining means for conducting floor plan processing, basic cell placement means for conducting basic cell placement processing, global routing route determining means for conducting global routing processing, and detailed routing route determining means for conducting detailed routing processing, the global routing route determining means comprising first determination means for determining whether routing of a desired net is possible or not based on a wire capacitance at each global routing cell boundary formed by the division of the logic circuit chip into global routing cells, and second determination means for determining whether routing of a desired net is possible or not based on a state of the use of a routing grid track in each global routing cell formed on the logic circuit chip.

In the preferred construction, the second determination means determines whether routing of the desired net is possible or not based on, out of grids as points of intersection between the routing tracks, the number of grids usable for routing.

In the preferred construction, the second determination means comprises number of usable grids calculating means for calculating, out of grids as points of intersection between the routing tracks, the number of grids usable for routing, number of grids to be used calculating means for calculating, based on a passing route of wires passing in the global routing cell, the number of grids to be used by the wires out of the grids, and routing possibility/impossibility determining means for determining whether routing of the desired net is possible or not based on a ratio of the number of grids usable for routing to the number of grids to be used by the wires.

In another preferred construction, the second determination means comprises number of usable grids calculating means for calculating, out of grids as points of intersection between the routing tracks, the number of grids usable for routing, number of grids to be used calculating means for calculating, based on a passing route of wires passing in the global routing cell, the number of grids to be used by the wires out of the grids, and determination means for comparing the number of grids usable for routing and the number of grids to be used by wires to determine that the routing is impossible when the number of grids to be used by wires is larger.

According to the third aspect of the invention, an automatic routing method of automatically conducting placement and routing of integrated circuits on an integrated circuit chip to be processed, comprising the steps of:

conducting floor plan processing, conducting basic cell placement processing, conducting global routing processing, and conducting detailed routing processing, the global routing processing step comprising the steps of dividing the logic circuit chip into global routing cells, calculating a wire capacitance of each global routing cell boundary formed at the division step, out of grids as points of intersection between routing tracks in each global routing cell formed at the division step, calculating the number of grids usable for routing, based on a passing route of wires passing in the global routing cell, calculating the number of grids to be used by the wires out of the grids, comparing the number of grids usable for routing calculated at the number of usable grids calculating step and the number of grids to be used by the wires calculated at the number of grids to be used calculating step, determining a routing route of every net such that at least the cost of the degree of wire congestion calculated at the wire capacitance calculating step and the cost of grid use rate for routing calculated at the number of usable grids calculating step are minimum, determining whether routing according to a routing route determined at the routing route determining step is possible or not based on the degree of wire congestion calculated at the wire capacitance calculating step, and determining whether routing according to a routing route determined at the routing route determination step is possible or not based on a comparison result obtained at the number of grids comparing step.

In the preferred construction, the step of determining whether routing is possible or not based on a wire capacitance comprises the steps of:

determining whether there exists the global routing cell boundary through which a larger number of wires pass than the wire capacitance calculated at the wire capacitance calculating step, and when determination is made at the determination step that there exists the global routing cell boundary through which a larger number of wires pass than the wire capacitance, ripping up a net passing through the global routing cell boundary to return the processing to the route determination step.

In the preferred construction, the step of determining whether routing is possible or not based on a ratio of the number of grids usable for routing to the number of grids to be used for the wires comprises the steps of:

determining whether there exists the global routing cell in which the number of grids to be used for the wires is larger than the number of grids usable for routing, and when determination is made at the determination step that there exists the global routing cell in which the number of grids to be used for the wires is larger than the number of grids usable for routing, ripping up a net passing through the global routing cell to return the processing to the route determination step.

In another preferred construction, the step of determining whether routing is possible or not based on a wire capacitance comprises the steps of:

determining whether there exists the global routing cell boundary through which a larger number of wires pass than the wire capacitance calculated at the wire capacitance calculating step, and when determination is made at the determination step that there exists the global routing cell boundary through which a larger number of wires pass than the wire capacitance, ripping up a net passing through the global routing cell boundary to return the processing to the route determination step, and the step of determining whether routing is possible or not based on a ratio of the number of grids usable for routing to the number of grids to be used for the wires comprises the steps of:

determining whether there exists the global routing cell in which the number of grids to be used for the wires is larger than the number of grids usable for routing, and when determination is made at the determination step that there exists the global routing cell in which the number of grids to be used for the wires is larger than the number of grids usable for routing, ripping up a net passing through the global routing cell to return the processing to the route determination step.

According to another aspect of the invention, a computer readable memory storing a control program for controlling an automatic routing device which automatically places and wires integrated circuits on an integrated circuit chip to be processed, the control program comprising the steps of:
conducting floor plan processing,
conducting basic cell placement processing,
conducting global routing processing, and
conducting detailed routing processing,
the global routing processing step comprising the steps of
dividing the logic circuit chip into global routing cells,
calculating a wire capacitance of each global routing cell boundary formed at the division step,
out of grids as points of intersection between routing tracks in each global routing cell formed at the division step, calculating the number of grids usable for routing,
based on a passing route of wires passing in the global routing cell, calculating the number of grids to be used by the wires out of the grids,
comparing the number of grids usable for routing calculated at the number of usable grids calculating step and the number of grids to be used by the wires calculated at the number of grids to be used calculating step,
determining a routing route of every net such that at least the cost of the wire capacitance calculated at the wire capacitance calculating step and the cost of the number of grids usable for routing calculated at the number of usable grids calculating step are minimum,
determining whether routing according to a routing route determined at the routing route determining step is possible or not based on the wire capacitance calculated at the wire capacitance calculating step, and
determining whether routing according to a routing route determined at the routing route determination step is possible or not based on a comparison result obtained at the number of grids comparing step.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings:

FIG. 6 is a diagram showing an example of application of global routing processing according to the present embodiment.

FIG. 8 is a diagram for use in explaining each processing of four steps to be executed in the automatic placement and routing processing shown in FIG. 7.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
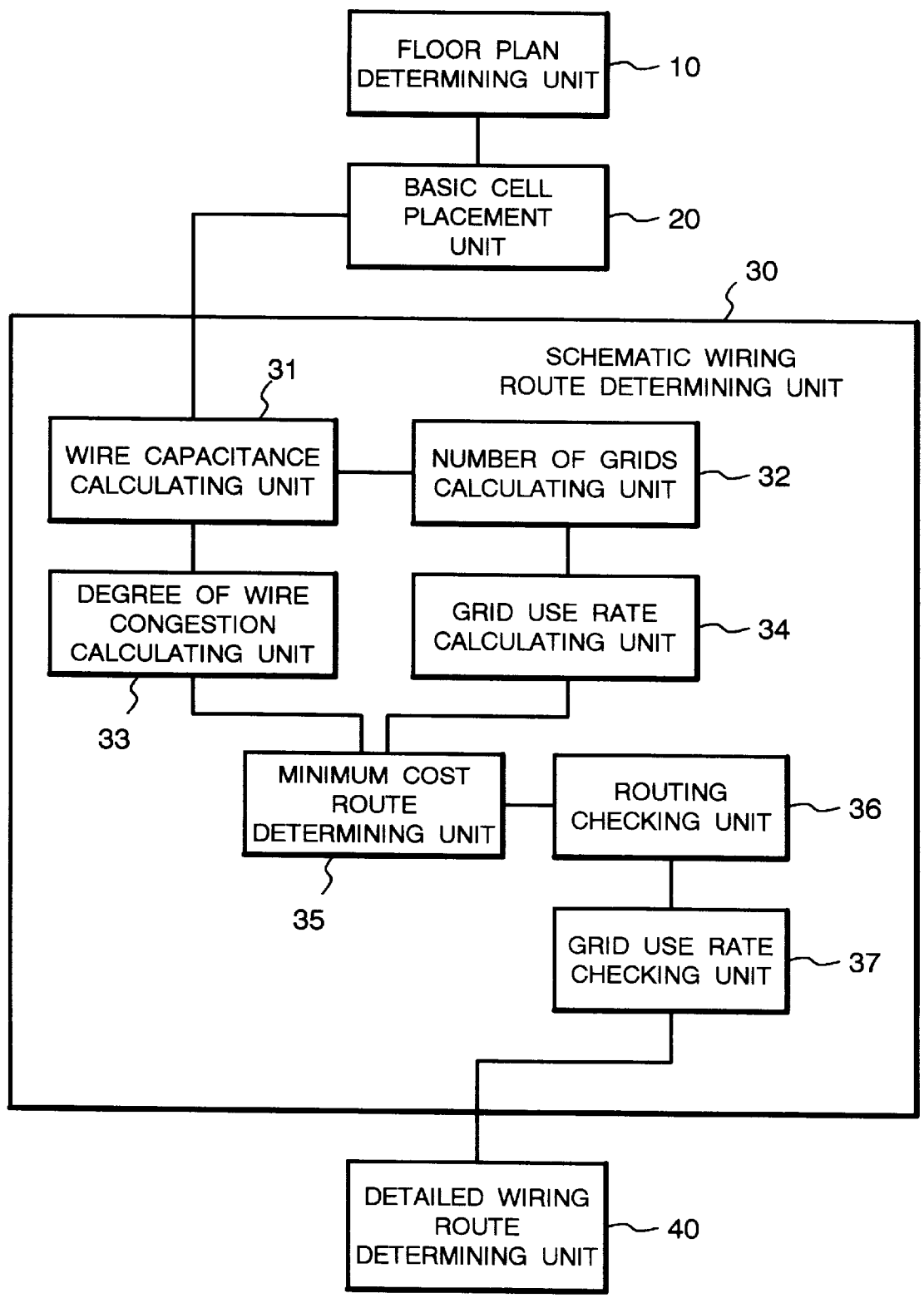
FIG. 1 is a block diagram showing structure of an automatic routing device according to one embodiment of the present invention.
Figure 2:
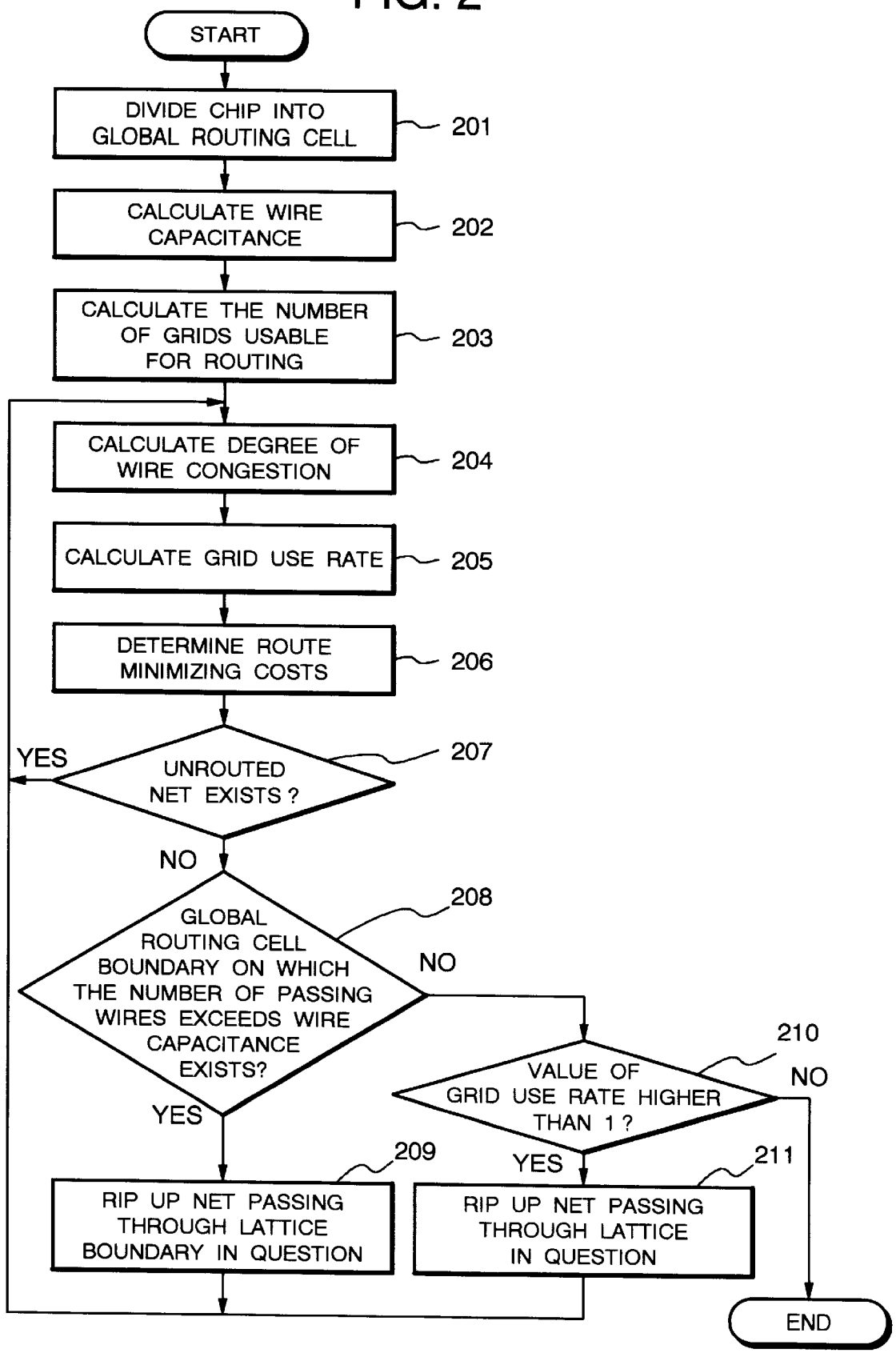
FIG. 2 is a flow chart showing operation of global routing processing in the present embodiment.
Figure 7:
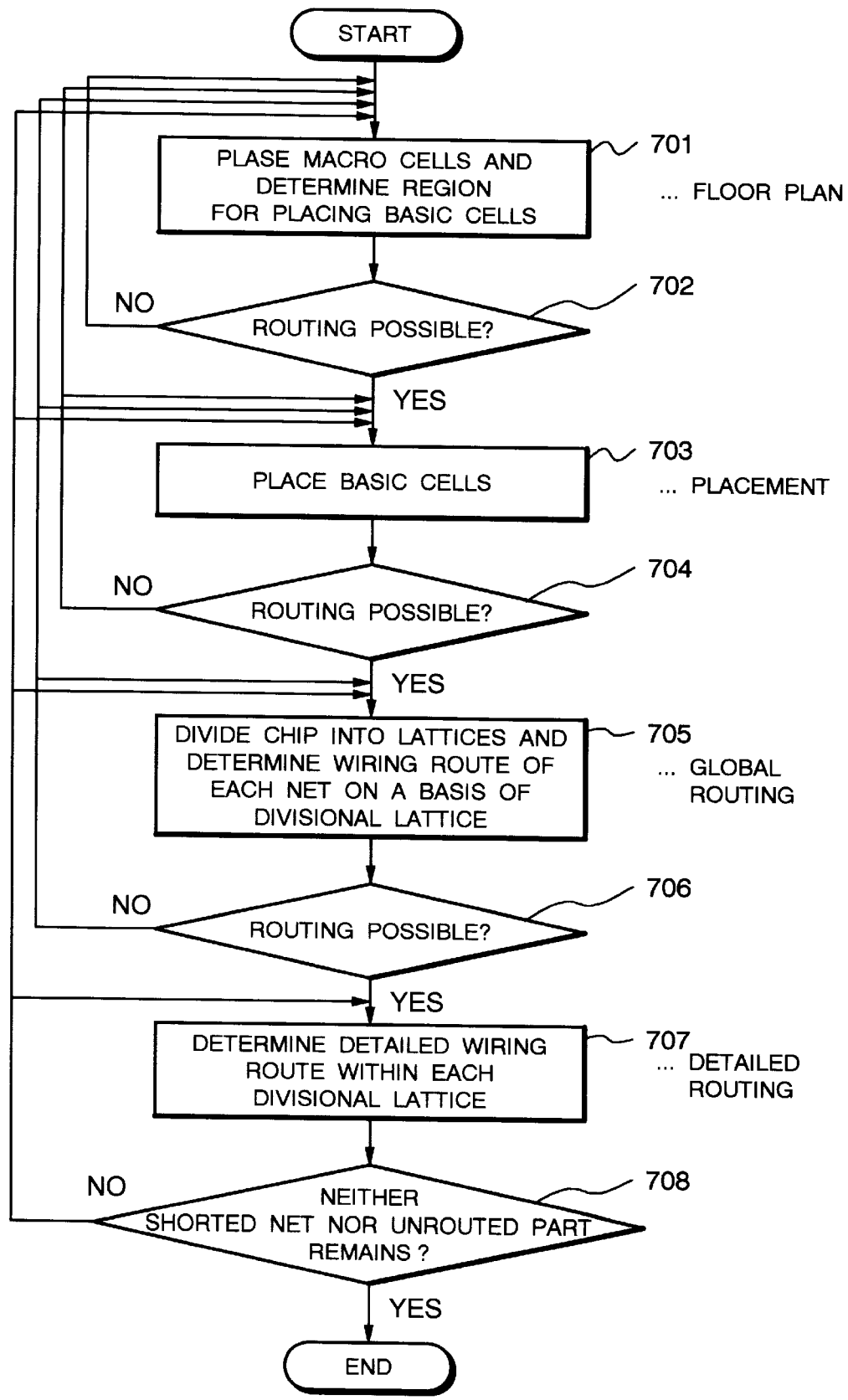
FIG. 7 is a flow chart showing a flow of integrated circuit automatic placement and routing processing in outline.
Figure 9:
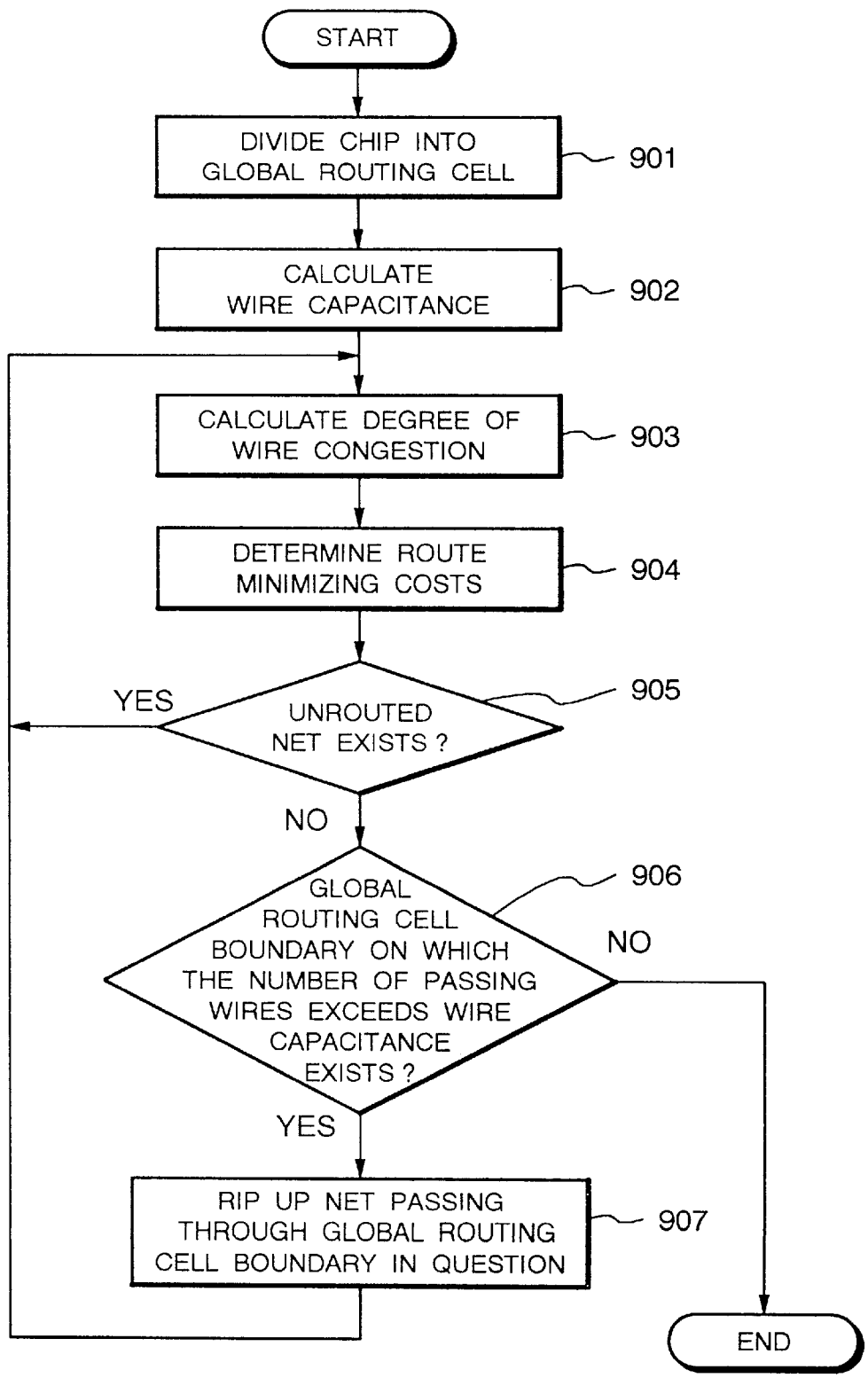
FIG. 9 is a flow chart specifically showing the contents of global routing processing in conventional automatic placement and routing processing.
Figure 10A:
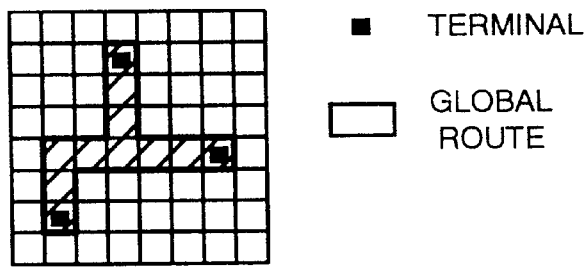
FIG. 10 is a global diagram showing a global route, global routing cell boundaries and global routing cells.
Figure 10B:
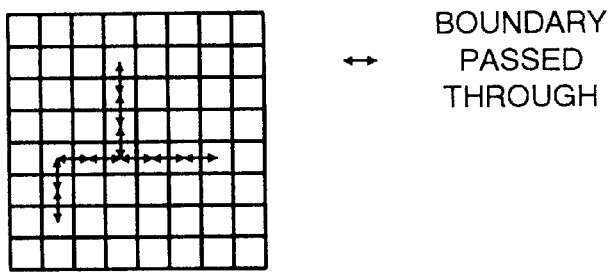
Figure 10C:
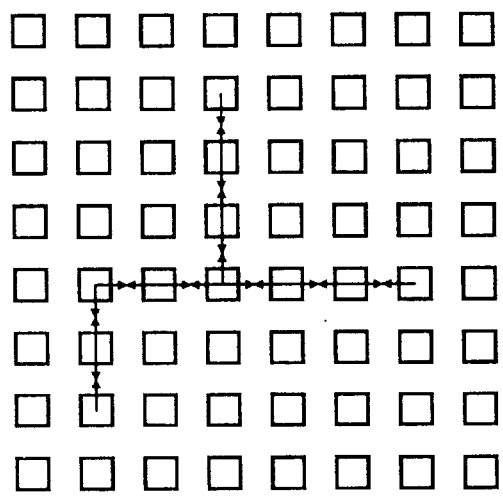

FIG. 1 is a block diagram showing structure of an integrated circuit automatic routing device according to one embodiment of the present invention. A flow of automatic placement and routing processing according to the present embodiment, similar to that of the conventional processing described with reference to FIG. 7, is in outline executed in four steps, floor plan processing, placement processing, global routing processing and detailed routing processing. In addition, as a general rule applicable for the entire processing, when determination is made that routing is impossible or that there exists a shorted net or unrouted net after the execution of each step of the floor plan processing, the placement processing, the global routing processing and the detailed routing processing, the immediately preceding processing is first conducted over again and if the execution of the processing achieves no improvement, processing is sequentially conducted over again retroactively to the preceding processing, similarly to the conventional automatic placement and routing processing shown in FIG. 7.

With reference to FIG. 1, an automatic routing device of the present embodiment includes a floor plan determining unit 10 for executing floor plan processing, a basic cell placement unit 20 for executing basic cell placement processing, a global routing route determining unit 30 for executing global routing processing and a detailed routing route determining unit 40 for executing detailed routing processing. In FIG. 1, illustration is made only of a characteristic part of the structure of the present embodiment and that of the remaining part is omitted.

Each of the above-described components is implemented by a processing device under control of a computer program at a computer system such as a work station or a personal computer. The control program is provided as storage in a storage medium such as a magnetic disk or a semiconductor memory and is loaded into the processing device of the computer system to execute the function of each component.

In the above-described structure, the floor plan determining unit 10 conducts the same floor plan processing as that of the conventional automatic placement and routing processing, the basic cell placement unit 20 conducts the same placement processing as that of the conventional automatic placement and routing processing and the detailed routing route determining unit 40 conducts the same detailed routing processing as that of the conventional automatic placement and routing processing.

The global routing route determining unit 30, as shown in FIG. 1, includes a wire capacitance calculating unit 31 for calculating a wire capacitance of a global routing cell boundary, a number of grids calculating unit 32 for calculating the number of grids which can be wired in a global routing cell, a degree of wire congestion calculating unit 33, a grid use rate calculating unit 34 and a minimum cost route determining unit 35 for the determination of a global route, and a routing checking unit 36 and a grid use rate checking unit 37 for the determination of routing possibility/impossibility.

The wire capacitance calculating unit 31 calculates a wire capacitance at each global routing cell boundary formed by the division of the chip into global routing cells. The wire capacitance calculating method is the same as that in conventional global routing processing.

The number of grids calculating unit 32 calculates the number of grids usable for routing in each global routing cell formed on the chip. Grid here represents a point of intersection between routing tracks in a global routing cell. A total number of grids in each global routing cell is equal to [the number of routing tracks in the right-and-left direction]×[the number of routing tracks in the up-and-down direction] of the global routing cell. Since there is a case where a routing inhibited region exists within a global routing cell, the number of grids usable for routing is less than or equal to the total number of grids in a global routing cell in question, which is obtained by the following expression:

[the total number of grids]−[the number of grids which can not be used because of the existence of routing inhibited region].

The degree of wire congestion calculating unit 33 calculates a degree of wire congestion based on a wire capacitance of a global routing cell boundary and already determined global routes. The method of calculating a degree of wire congestion is the same as that in the conventional global routing processing and is obtained by the following expression:

[the number of passing global routes]−[wire capacitance].

The grid use rate calculating unit 34 calculates a grid use rate in each global routing cell based on the number of usable grids in the global routing cell calculated by the number of grids calculating unit 32 and an estimated number of grids to be used for already determined global routes. Estimated number of grids to be used represents the number of grids to be used by wires in question within a global routing cell in question calculated based on a route of the wires passing through the global routing cell. Grid use rate represents a ratio of an estimated number of grids to be used in a global routing cell to the number of usable grids in the global routing cell, which is defined by [the estimated number of grids to be used in global routing cell]/[the number of usable grids in global routing cell]. Routing to have a grid use rate higher than 1 is therefore impossible.

The minimum cost route determining unit 35 determines, based on the cost of distance, the cost of a degree of wire congestion on a global routing cell boundary, the cost of a grid use rate, the cost of bend and other various kinds of costs, a routing route minimizing these costs. The method of determining such route is the same as the minimum cost route determining method in the conventional automatic placement and routing processing with the only difference being that the cost of a grid use rate is taken into consideration.

The routing checking unit 36, after routing is conducted with respect to all the nets through the processing by the degree of wire congestion calculating unit 33, the grid use rate calculating unit 34 and the minimum cost route determining unit 35, sees if the number of wires passing through each global routing cell boundary exceeds a wire capacitance of the global routing cell boundary. Then, when there is a global routing cell boundary at which the number of passing wires exceeds its wire capacitance, a net passing through the global routing cell boundary is tore away to again cause the degree of wire congestion calculating unit 33, the grid use rate calculating unit 34 and the minimum cost route determining 35 to conduct their processing.

The grid use rate checking unit 37, after routing is conducted with respect to all the nets through the processing by the degree of wire congestion calculating unit 33, the grid use rate calculating unit 34 and the minimum cost route determining unit 35, sees if a grid use rate at each global routing cell is higher than 1. Then, if there is a global routing cell whose grid use rate is higher than 1, a net passing through the global routing cell is tore away to again cause the degree of wire congestion calculating unit 33, the grid use rate calculating unit 34 and the minimum cost route determining unit 35 to conduct their processing.

Figure 3:
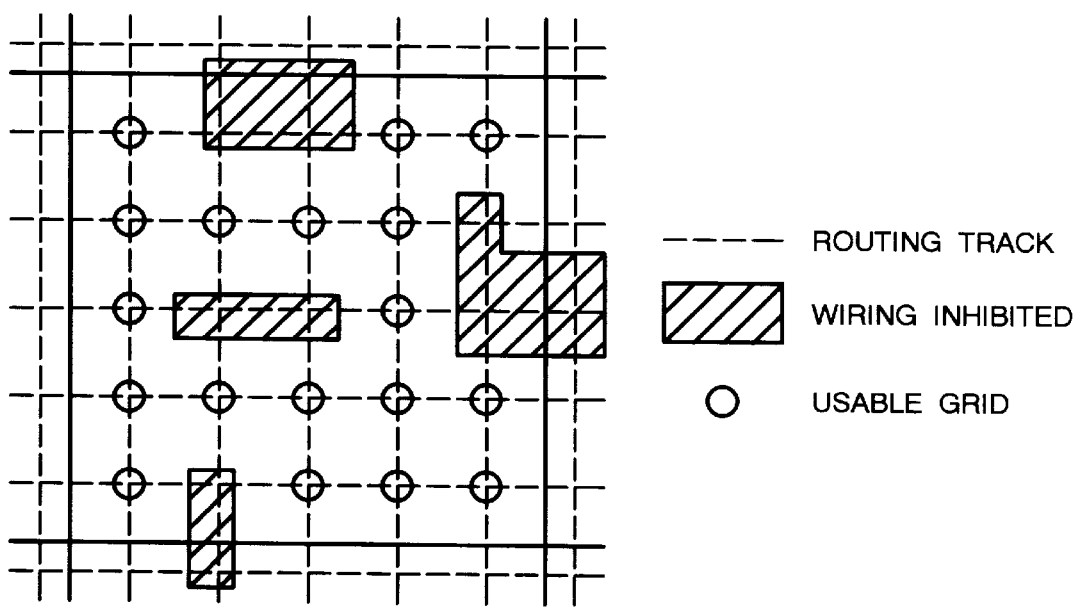
FIG. 3 is a diagram for use in explaining a method of calculating the number of usable grids.

Next, global routing processing according to the present embodiment will be described with reference to the flow chart of FIG. 2 and FIGS. 3 to 5. In the global routing route determining unit 30, first, the wire capacitance calculating unit 31 divides a chip to be processed into global routing cells (Step 201) to calculate a wire capacitance at each global routing cell boundary (Step 202). Next, the number of grids calculating unit 32 calculates the number of grids usable for routing at each global routing cell (Step 203). With reference to FIG. 3, a method of calculating the number of grids usable for routing will be specifically described.

Figure 11:
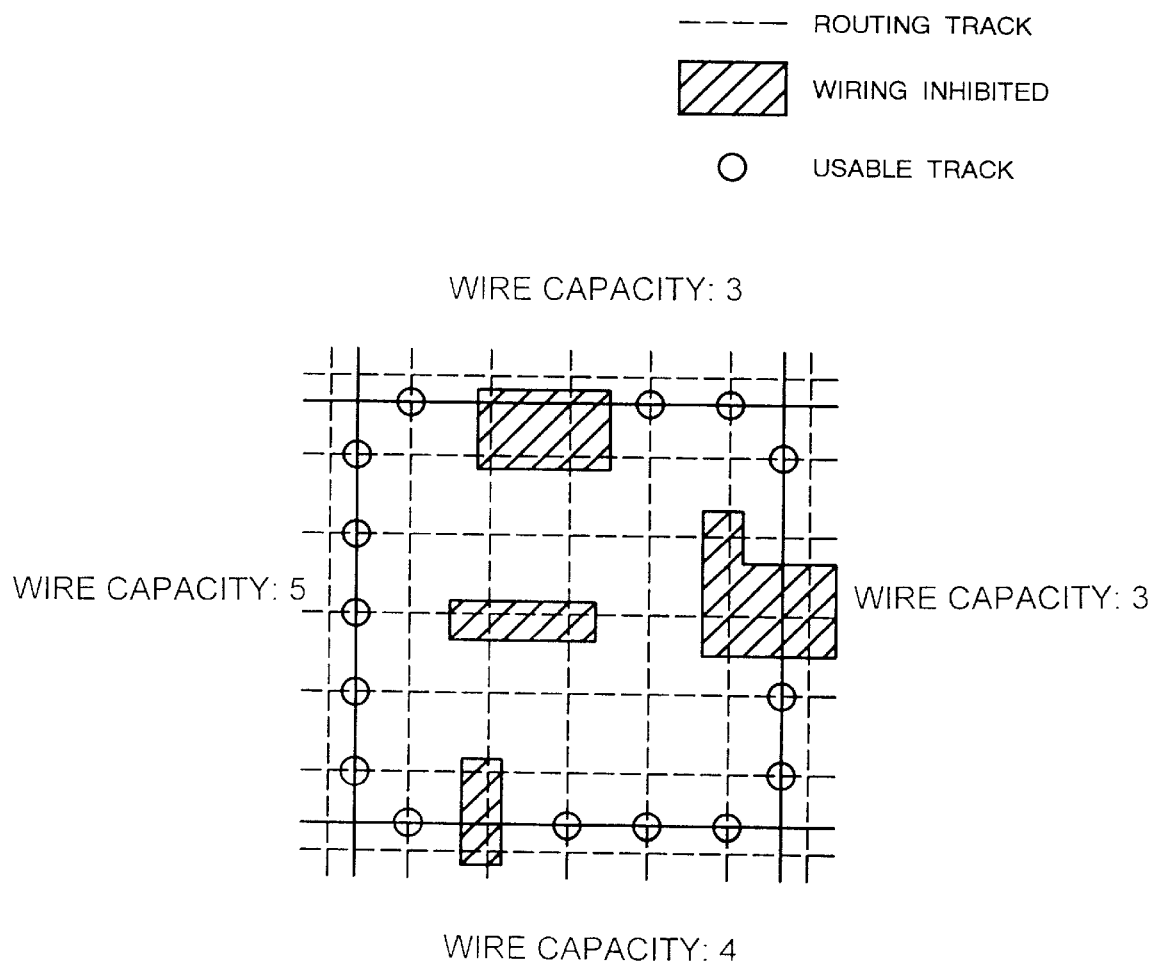
FIG. 11 is a diagram for use in explaining a wire capacitance calculation method.
Figure 12:
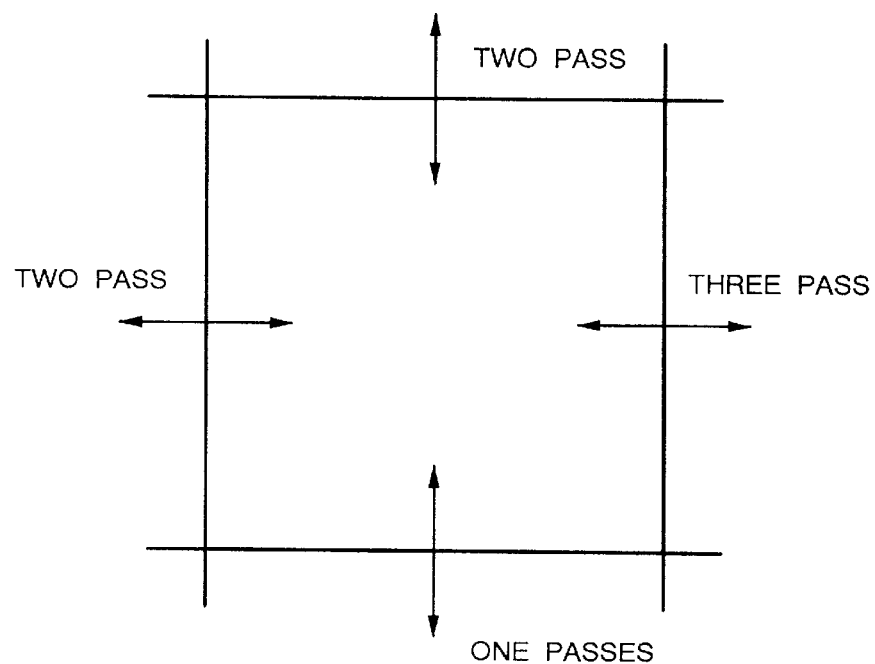
FIG. 12 is a diagram showing one example of a global route.
Figure 13:
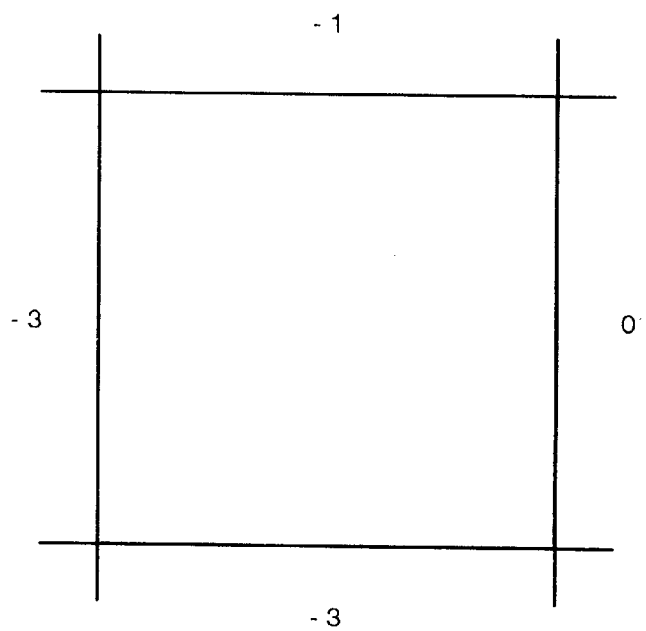
FIG. 13 is a diagram showing one example of a degree of wire congestion.
Figure 14A:
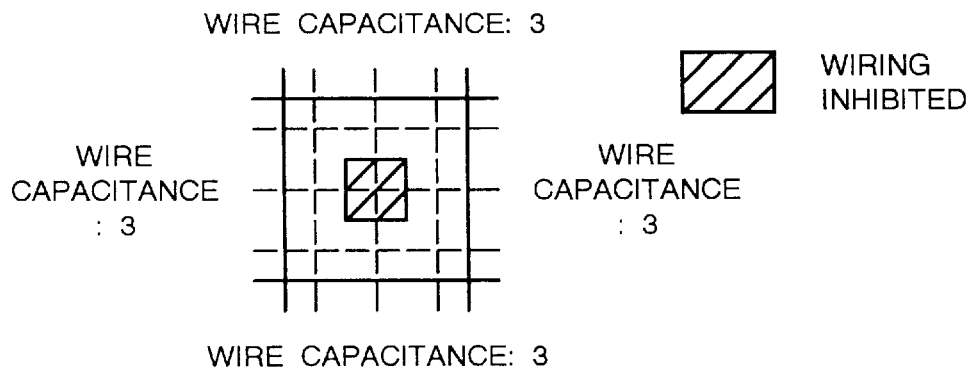
FIG. 14 is a diagram showing an example of application of the global routing processing in the conventional automatic placement and routing processing.
Figure 14B:
Figure 14C:
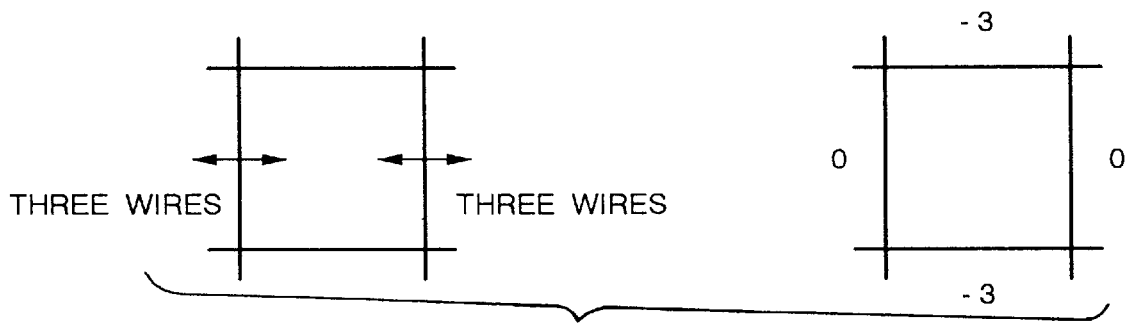
Figure 14D:
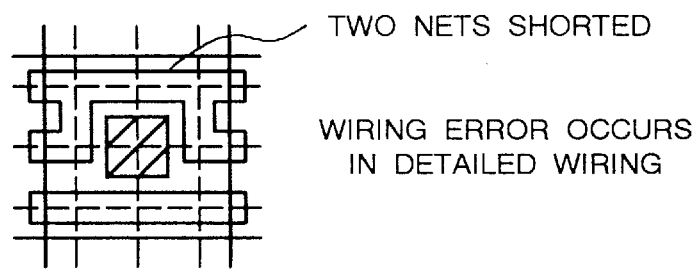

FIG. 3 is a diagram showing grids usable for routing at a global routing cell having the same structure as that shown in FIG. 11. In FIG. 3, a region surrounded by solid lines corresponds to one global routing cell. A routing track is denoted by a dotted line and a routing inhibited region is denoted by slant lines. In the global routing cell illustrated in FIG. 3, five routing tracks exist in the right-and-left direction and five routing tracks exist in the up-and-down direction. The total number of grids is therefore 25 (=5×5) (in an actual global routing cell, approximately 20 routing tracks exist both in the right-and-left direction and in the up-and-down direction and the total number of grids is approximately 400 (=20×20)). However, since a routing inhibited region exists, the number of grids usable for routing will be less than the above described total number of grids, 25. In FIG. 3, usable grids within the global routing cell are indicted by white rounds. The actual number of usable grids will be 18 (=25−7), which is a value obtained by subtracting 7, the number of grids included in the routing inhibited region, from 25, the above-described total number of grids.

Next, the degree of wire congestion calculating unit 33 calculates a degree of wire congestion at each global routing cell boundary (Step 204). Then, the grid use rate calculating unit 34 calculates a grid use rate at each global routing cell (Step 205). With reference to FIGS. 4 and 5, a method of calculating an estimated number of grids to be used and a grid use rate will be specifically described.

Figure 4A:
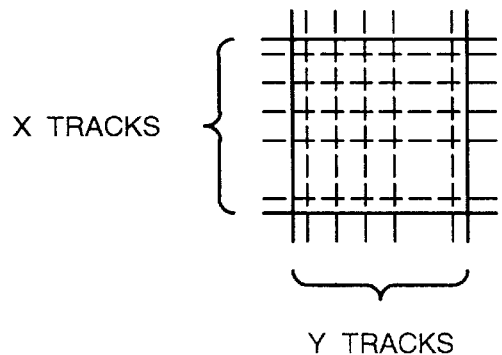
FIG. 4 is a diagram for use in explaining a method of calculating an estimated number of grids to be used in the present embodiment.
Figure 4B:
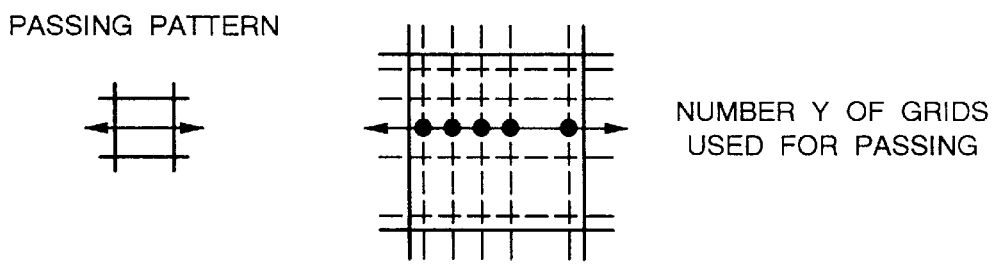
Figure 4C:
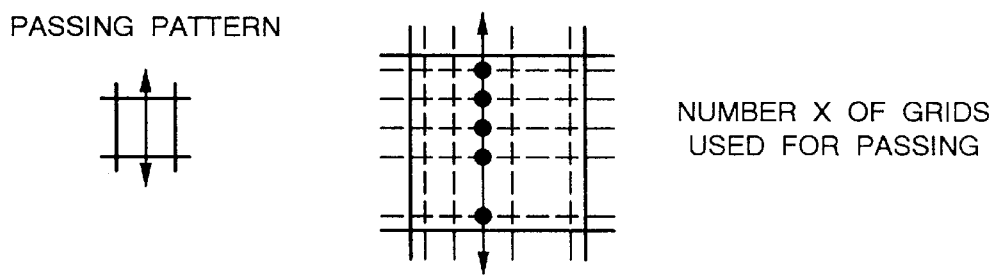
Figure 4D:
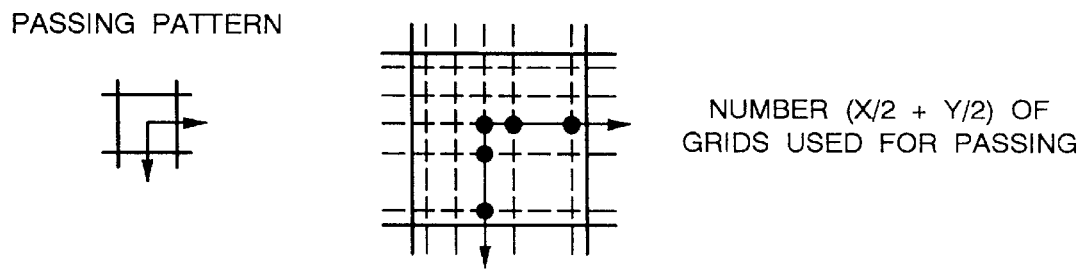
Figure 5:
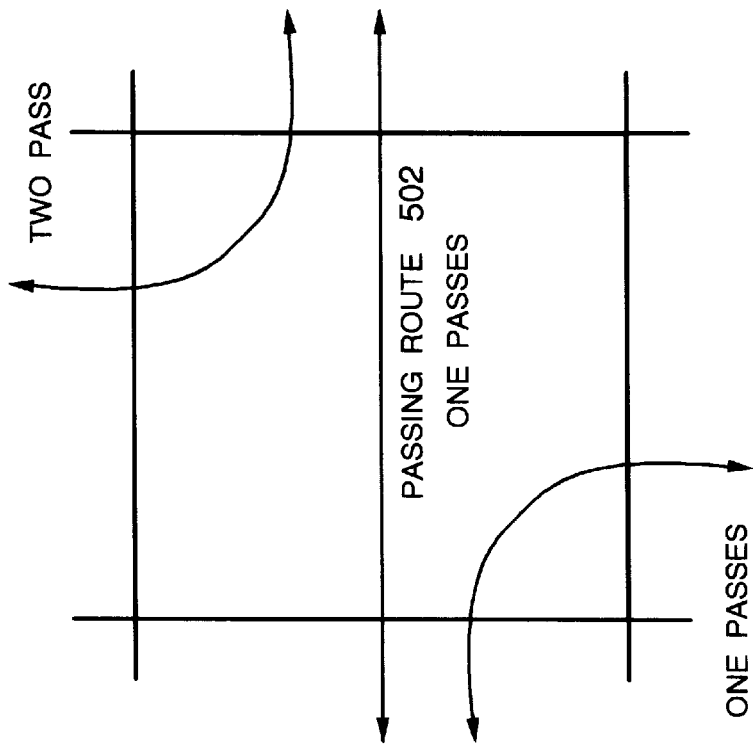
FIG. 5 is a diagram showing calculation examples of an estimated number of grids to be used and a grid use rate.

In FIG. 4(A) to (D), at a global routing cell denoted by solid lines, a number x of routing tracks exist in the right-and-left direction and a number y of routing tracks exist in the up-and-down direction (see FIG. 4(A)). In this state, possible patterns of wires passing through the global routing cell are three, a passing pattern on which one wire is provided in the right-and-left direction (FIG. 4(B), hereinafter referred to as a right-and-left passing pattern), a passing pattern on which one wire is provided in the up-and-down direction (FIG. 4(C), hereinafter referred to as an up-and-down passing pattern) and a passing pattern on which one wire turns at a right angle (passing through two adjacent global routing cell boundaries) within the global routing cell (FIG. 4(D), hereinafter referred to as an adjacent passing pattern). The right-and-left passing pattern uses a number y of grids for one wire to pass through the global routing cell. The up-and-down passing pattern uses a number x of grids for one wire to pass through the global routing cell. The adjacent passing pattern uses a number (x/2+y/2) of grids for one wire to pass through the global routing cell. Although FIG. 4(D) illustrates one passing pattern on which a wire passes through the right and the lower global routing cell boundaries (hereinafter referred to as a lower right passing pattern), this is also the case with a passing pattern on which a wire passes through the lower and the left global routing cell boundaries (hereinafter referred to as a lower left passing pattern), a passing pattern on which a wire passes through the left and the upper global routing cell boundaries (hereinafter referred to as an upper left passing pattern) and a passing pattern on which a wire passes through the upper and the right global routing cell boundaries (hereinafter referred to as an upper right passing pattern). Then, an estimated number of grids to be used within the global routing cell is obtained by calculating the following equation with respect to all the passing routes and adding the calculation results:

[an estimated number of grids to be used for each passing route]= [the number of grids to be used for one wire determined according to the passing route]×[the number of wires passing through the passing route].

On the foregoing premises, an estimated number of grids to be used and a grid use rate in the global routing cell shown in FIG. 5 are calculated. In the example shown in FIG. 5, five routing tracks exist in the right-and-left direction and five routing tracks exist in the up-and-down direction. Then, two wires pass through a passing route 501 as an upper right passing pattern, one passes through a passing route 502 as a right-and-left passing pattern and one passes through a passing route 503 as a lower left passing pattern. In this case, an estimated number of grids to be used for each passing route is obtained by the following expressions:

passing route 501: (5/2+5/2)×2=10 passing route 502: 5×1=5 passing route 503: (5/2+5/2)×1=5.

An estimated number of grids to be used in the global routing cell therefore totals 20 (=10+5+5). When the number of usable grids in the global routing cell is 18 as shown in FIG. 3 and the estimated number of grids to be used in the global routing cell is 20 as shown in FIG. 5, a grid use rate will be 1.11 (=20/18).

Next, the minimum cost route determining unit 35, taking various costs including the cost of distance, the cost of a degree of wire congestion on a global routing cell boundary and the cost of a grid use rate into consideration, determines a route minimizing these costs (Step 206).

The foregoing processing at Step 204 to Step 206 will be repeated until routing of all the nets is completed (Step 207). More specifically, the operation at Steps 204 to 207 will determine a route minimizing costs based on a grid use rate in addition to a wire capacitance until no unrouted net remains.

Next, the routing checking unit 36 sees if there exists a global routing cell boundary on which the number of passing wires exceeds its wire capacitance and if such a global routing cell boundary exists, a net passing through the global routing cell boundary is tore away to return to Step 204 (Steps 208 and 209).

When there exists no global routing cell boundary on which the number of passing wires exceeds a wire capacitance, the grid use rate checking unit 37 next sees if there exists a global routing cell having a grid use rate is higher than 1 and if such a global routing cell exists, a net passing through the global routing cell is tore away to return to Step 204 (Steps 210 and 211). For example, the grid use rate calculated with reference to FIG. 5 is 1.11, a value higher than 1, and therefore, a net having such routing as illustrated in FIG. 5 will be tore away.

Thus, when there exists no net whose routing is determined to be impossible based neither on a wire capacitance nor on a grid use rate, the global routing processing is completed. Although in the above-described operation example, a check on a grid use rate is made after a check on a wire capacitance (Steps 208 and 210), either may be made first because these two are independent processing.

Next, functions of the global routing processing according to the present embodiment will be specifically described with reference to FIG. 6. FIG. 6 shows a state of global routing processing conducted according to the present embodiment with respect to a global routing cell having the same structure as that illustrated in FIG. 14. More specifically, three routing tracks exist in the right-and-left direction and three routing tracks exist also in the up-and-down direction as shown in FIG. 6(A). In this global routing cell, a region including one grid as a central point of intersection and denoted by slant lines is a routing inhibited region. In such a case as this, wire capacitances at the respective global routing cell boundaries are all 3 as has been described in the Related Art. The number of grids usable for routing is eight, which is a value obtained by subtracting one, the number of grids within the routing inhibited region, from nine (=3×3), the total number of grids.

At the global routing cell illustrated in FIG. 6(A), to pass three wires as a global route in the right-and-left direction as illustrated in FIG. 6(B) will result in having such degrees of wire congestion on the global routing cell boundaries as shown in FIG. 6(C), among which no positive value exists. Based only on a degree of wire congestion, therefore, determination can be made that routing is possible because the number of nets passing through each global routing cell boundary does not exceed the wire capacitance.

Next, calculate a grid use rate. In this global routing cell, an estimated number of grids to be used per wire is three and an estimated number of grids to be used within the global routing cell is nine (3×3) accordingly. In addition, the number of grids usable for routing is eight as mentioned above. As a result, a grid use rate will be 1.12 (=9/8), a value higher than 1, and determination is therefore made that the routing in question is impossible.

As described in the foregoing, according to the global routing processing of the present embodiment, the determination based on a grid use rate can in some cases eliminate routing which might be erroneously determined to be possible based only on a wire capacitance. In this case, it is possible to prevent a probability that routing error as illustrated in FIG. 6(E) will occur at the detailed routing processing. As a result, the probability can be drastically reduced that routing determined to be possible at the global routing processing will be determined to be impossible at the detailed routing processing.

The present invention is not limited to the above-described embodiment but allows various modifications and variations within the spirit and scope of the present invention. For example, while the above-described embodiment employs the number of usable grids, it is clear that an area of an unused region in each global routing cell may be employed in place of it. In addition, as long as at least the cost of a degree of wire congestion on a global routing cell boundary and the cost of a grid use rate are employed as the costs to be taken into consideration for determining a minimum cost route, not all the costs set forth above are necessary.

As described in the foregoing, since the automatic routing device of the present invention and a routing method thereof determine a routing route of each net based on a grid use rate in addition to a wire capacitance on a global routing cell boundary, a probability can be drastically lessened that routing determined to be possible at the global routing processing will be determined to be impossible at the detailed routing processing. As a result, time required for automatic placement and routing processing can be reduced.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. An automatic routing method for automatic global routing of integrated circuits on an integrated circuit chip, comprising:
   dividing said integrated circuit chip into a plurality of global cells; and
   determining a route of each net in each global routing cell based one a degree of wire congestion at each global routing cell boundary and a grid use rate at each global routing cell.

2. An automatic routing method for automatic placement and global routing of integrated circuits on an integrated circuit chip, comprising:
   floor plan processing for placing macro cells and for determining a region in which basic cells are to be placed;
   basic cell placement processing;
   global routing processing for dividing said integrated circuit chip into a plurality of global routing cells and determining a route of each net in each global routing cell based on a degree of wire congestion at each global routing cell boundary and a grid use rate at each global routing cell; and
   detailed routing processing for determining a detailed route within each global routing cell.

3. An automatic routing method for automatic placement and global routing of integrated circuits on an integrated circuit chip, comprising:
   dividing said logic circuit chip into a plurality of global routing cells;
   calculating a wire capacity of each global routing cell boundary, the wire capacity indicating how many wires can pass through each global routing cell boundary;
   calculating a number of grids usable for routing in each global routing cell; and
   determining a route of every net such that the cost is minimized based on said wire capacity and said grid use rate representing a ratio of a number of grids to be used divided by the number of useable grids.

4. An automatic routing method for automatic placement and global routing of integrated circuits as set forth in claim 3, further including
   determining whether there exists a global routing cell boundary through which a larger number of wires pass than allowed by said wire capacity;
   deleting a net passing through said global routing cell boundary and returning to said determining a route when there exist a global routing cell boundary through which a larger number of wires pass than allowed by said wire capacity;
   determining whether there exists a global routing cell in which an estimated number of grids to be used for wires is larger than said number of grids usable for routing; and deleting a net passing through said global routing cell and returning to said determining a route when there exists said global routing cell in which said estimated number of grids to be used for the wires is larger than said number of grids usable for routing.

5. An automatic routing method for automatic placement and global routing of integrated circuits as set forth in claim 3, wherein determining a route comprises:

calculating a degree of congestion of wires that indicates how many wires can be passed through a global routing cell boundary according to said wire capacity of said global routing cell boundary and an already determined global routing;

calculating a grid use rate in each global routing cell based on an estimated number of grids to be used for wires and said number of grids usable for routing; and calculating a route such that at least a cost of said degree or wire congestion at each global routing cell boundary and a cost of said grid use rate for routing are minimized, and wherein said determining a route is repeated until there is not unrouted net.

6. An automatic routing method for automatic placement and global routing of integrated circuits as set forth in claim 3, wherein the cost of said grid use rate comprises a cost of distance.

7. An automatic routing method for automatic placement and global routing of integrated circuits as set forth in claim 3, wherein the cost of said grid use rate comprises a cost of distance and a cost of bends.

8. A computer readable memory storing a control program for controlling an automatic routing which automatically places and wires integrated circuits on an integrated circuit chip, said control program comprising:

dividing said integrated circuit chip into a plurality of global routing cells; and determining a route of each net in each global routing cell based on a degree of wire congestion at each global routing cell boundary and a grid use rate at each global routing cell.

9. A computer readable memory storing a control program for controlling an automatic routing which automatically places and wires integrated circuits on an integrated circuit chip, said control program comprising:

floor plan processing for placing macro cell and for determining a region in which basic cells are to be placed;

basic cell placement processing;

global routing processing for dividing said integrated circuit chip into a plurality of global routing cells and determining a route of each net at each global routing cell based on a degree of wire congestion at each global routing cell boundary and a grid use rate at each global routing cell; and detailed routing processing for determining a detailed route within each global routing cell.

10. A computer readable memory storing a control program for controlling an automatic routing which automatically places and wires integrated circuits on an integrated circuit chip, said control program comprising:

dividing said logic circuit chip into a plurality of global routing cells;

calculating a wire capacity of each global routing cell boundary, the wire capacity indicating how many wires can pass through each global routing cell boundary;

calculating a number of grids usable for routing in each global routing cell; and determining a route of every net such that the cost is minimized based on said wire capacity and said grid use rate representing a ratio of a number of grids to be used divided by the number of useable grids.

11. A computer readable memory storing a control program for controlling an automatic routing as set forth in claim 10, said control program further comprising:

determining whether there exists a global routing cell boundary through which a larger number of wires pass than allowed by said wire capacity;

deleting a net passing through said global routing cell boundary and returning to said determining a route when there exists a global routing cell boundary through which a larger number of wires pass than allowed by said wire capacity;

determining whether there exists a global routing cell in which an estimated number of grids to be used for wires is larger than said number of grids usable for routing; and deleting a net passing through said global routing cell and returning to said determining a route when there exists said global routing cell in which said estimated number of grids to be used for the wires is larger than said number of grids usable for routing.

12. A computer readable memory storing a control program for controlling an automatic routing as set forth in claim 10, wherein determining a route comprises:

calculating a degree of congestion of wires that indicates how many wires can be passed through a global routing cell boundary according to said wire capacity of said global routing cell boundary and an already determined global routing;

calculating a grid use rate in each global routing cell based on an estimated number of grids to be used for wires and said number of grids usable for routing; and calculating a route such that at least a cost of said degree of wire congestion at each global routing cell boundary and a cost of said grid use rate for routing are minimized, and wherein said determining a route is repeated until there is no unrouted net.

13. A computer readable memory storing a control program for controlling an automatic routing as set forth in claim 12, wherein the cost of said grid use rate comprises a cost of distance.

14. A computer readable memory storing a control program for controlling an automatic routing as set forth in claim 12, wherein the cost of said grid use rate comprises a cost of distance and a cost of bends.

* * * * *